(12) United States Patent  
Nakamura et al.

(10) Patent No.: US 7,643,366 B2
(45) Date of Patent: Jan. 5, 2010

(54) SEMICONDUCTOR INTEGRATED CIRCUIT

(75) Inventors: Toshihiro Nakamura, Kyoto (JP); Masanobu Hirose, Kyoto (JP)

(73) Assignee: Panasonic Corporation, Osaka (JP)

( * ) Notice: Subject to any disclaimer, the term of this patent is extended or adjusted under 35 U.S.C. 154(b) by 222 days.

(21) Appl. No.: 11/797,405

(22) Filed: May 3, 2007

(65) Prior Publication Data

US 2007/0274149 A1    Nov. 29, 2007

(30) Foreign Application Priority Data

May 10, 2006   (JP) ............................. 2006-131367

(51) Int. Cl.
*G11C 8/00* (2006.01)

(52) U.S. Cl. ..................... 365/226; 365/227; 716/5; 716/7

(58) Field of Classification Search ............. 365/226, 365/227; 716/5, 7
See application file for complete search history.

(56) References Cited

U.S. PATENT DOCUMENTS

| | | | |
|---|---|---|---|
| 6,163,493 A | 12/2000 | Yamagata et al. | |
| 6,418,075 B2 | 7/2002 | Shimano et al. | |
| 7,346,869 B2 * | 3/2008 | Tai et al. | 716/5 |
| 2003/0001171 A1 * | 1/2003 | Banno et al. | 257/207 |
| 2003/0062559 A1 | 4/2003 | Tamaki | |
| 2006/0095870 A1 * | 5/2006 | Tai et al. | 716/1 |
| 2006/0126375 A1 | 6/2006 | Bonzo et al. | |
| 2006/0239102 A1 * | 10/2006 | Saita et al. | 365/226 |

FOREIGN PATENT DOCUMENTS

JP        11-214649        8/1999

\* cited by examiner

*Primary Examiner*—Son Dinh
*Assistant Examiner*—Toan Le
(74) *Attorney, Agent, or Firm*—McDermott Will & Emery LLP

(57) ABSTRACT

A plurality of memory macros, to which first power is supplied, and a logic circuit block, to which second power is supplied, are provided. The memory macros are collectively disposed as a memory block on a semiconductor chip, and memory power wires for supplying the first power to the memory macros that form the memory block are provided over the memory block.

19 Claims, 3 Drawing Sheets

SEMICONDUCTOR INTEGRATED CIRCUIT

CROSS-REFERENCE TO RELATED APPLICATION

The disclosure of Japanese Patent Application No. 2006-131367 filed on May 10, 2006 including specification, drawings and claims is incorporated herein by reference in its entirety.

BACKGROUND OF THE INVENTION

1. Field of the Invention

The present invention relates to a semiconductor integrated circuit in which memories and logic circuits, analog circuits, etc. are included.

2. Description of the Related Art

In an application specification integrated circuit (ASIC), memories and logic circuits, analog circuits, etc. are often included (see Japanese Laid-Open Publication No. 11-214649, for example).

FIG. 3 is a block diagram illustrating an example of a conventional semiconductor integrated circuit. This semiconductor integrated circuit includes memory macros, a logic circuit block, power circuit macros for the memory macros, power terminals, power wires, etc.

The semiconductor integrated circuit shown in FIG. 3 has a structure in which a logic circuit block 32, memory macros 33, logic circuit power terminals 35, memory power terminals 36, logic circuit power wires 37, memory power wires 38, power circuit macros 39, internal power wires 40, memory high-voltage power terminals 41, and memory high-voltage power wires 42 are provided on a semiconductor chip 31.

Power for operating the logic circuit block 32 is supplied to the logic circuit block 32 from the logic circuit power terminals 35 through the logic circuit power wires 37. Power for operating the memory macros 33 is supplied to the memory macros 33 from the memory power terminals 36 through the memory power wires 38, while power generated by the power circuit macros 39 is supplied to the memory macros 33 through the internal power wires 40. The power circuit macros 39 generate the power from power supplied thereto from the memory high-voltage power terminals 41 through the memory high-voltage power wires 42.

Of the two power supply voltages supplied to each memory macro 33, the voltage supplied through the memory power wire 38 is used for operation of a logic circuit section provided in the memory macro 33. On the other hand, the power supply voltage supplied through the memory high-voltage power wire 42 is used as power for a memory core portion in the memory macro 33, to be specific, as word line power and memory cell substrate power. The power supply voltage supplied through the memory power wire 38 is about 1.2 V, and the power supply voltage supplied through the memory high-voltage power wire 42 is about 3.3 V, for example.

In this semiconductor integrated circuit, the logic circuit block 32 and the memory macros 33 having the different power sources are provided on the semiconductor chip 31 in a mixed manner. The logic circuit power terminals 35 and the memory power terminals 36 for supplying power to the logic circuit block 32 and the memory macros 33, respectively, are provided around the peripheries of the logic circuit block 32 and memory macros 33 at irregularly spaced intervals.

For example, as shown in FIG. 3, in the case where the memory macros 33 are disposed on the right and left sides of the semiconductor chip 31, the memory power terminals 36 for supplying power to the respective memory macros 33 are provided at the right and left sides of the semiconductor chip 31. This is because it is preferable that the lengths of the memory power wires 38 be minimized in order to reduce voltage drops, wire delays and so on in the memory power wires 38 that connect the memory macros 33 and the memory power terminals 36 which supply power to the memory macros 33.

The power circuit macros 39 are in a one-to-one correspondence with the memory macros 33 and are provided in or adjacent to the respective memory macros 33.

However, the above-described conventional semiconductor integrated circuit has a problem in that the wire efficiency therein declines as the power wire resistance increases.

Specifically, in the conventional semiconductor integrated circuit, since the logic circuit block and the memory macros are disposed on the semiconductor chip at irregularly spaced intervals, the logic circuit power terminals and the memory power terminals are also placed on the semiconductor chip at irregularly spaced intervals. This causes the logic circuit power wires 37 and the memory power wires 38 to be present in a complicated manner on the semiconductor chip. As a result, the logic circuit power wires 37 and the memory power wires 38 may not be able to be collectively disposed around the logic circuit block 32 and the memory macros 33, respectively, in which case the power wire resistance will be increased and the wire efficiency will thus decline.

Furthermore, since the memory power terminals are placed on the semiconductor chip at irregularly spaced intervals, it is also necessary to route wires for supplying the memory power, outside the semiconductor chip. That is, in the above-described conventional semiconductor integrated circuit, the wiring outside the periphery of the semiconductor chip may also be adversely affected.

Moreover, since each memory macro is provided with the corresponding power circuit macro, the total area occupied by those power circuit macros is increased. That is, the area of the memory-related block is increased, resulting in an increase in the area of the entire semiconductor chip.

SUMMARY OF THE INVENTION

The present invention was made in view of the problems described above, and it is an object of the present invention to provide a semiconductor integrated circuit in which voltage drops in power wires to logic circuits and to memory macros are suppressed, and the wire efficiency on the semiconductor chip is increased to achieve a reduction in the entire semiconductor chip area, so that the chip area reduction and higher performance are attained.

In order to achieve the object, an inventive semiconductor integrated circuit includes: a plurality of memory macros, to which first power is supplied, and a logic circuit block, to which second power is supplied, wherein the memory macros are collectively disposed as a memory block on a semiconductor chip, and memory power wires for supplying the first power to the memory macros that form the memory block are provided over the memory block.

DETAILED DESCRIPTION OF THE INVENTION

Figure 1:
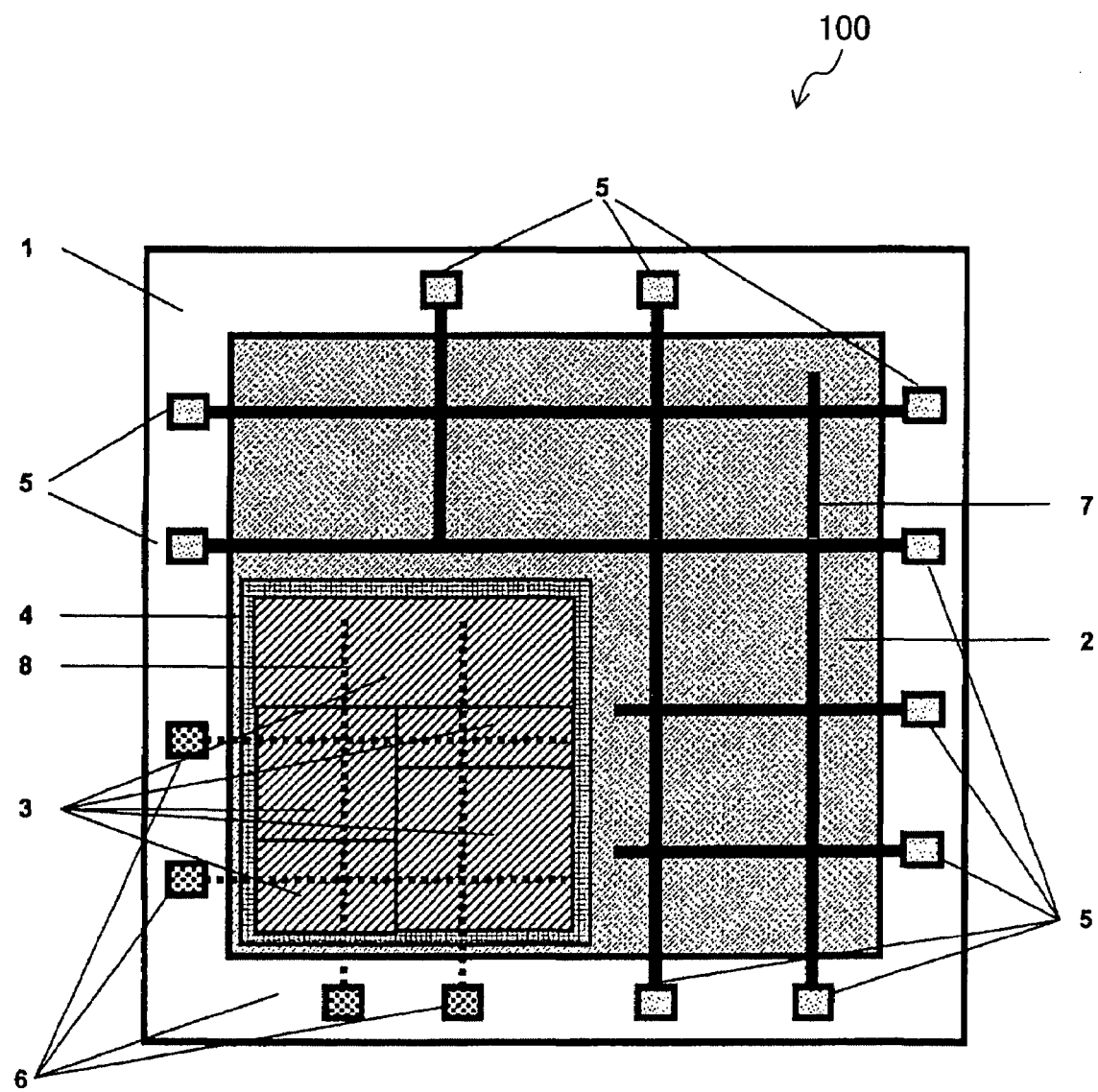
FIG. 1 is a view illustrating the structure of a semiconductor integrated circuit 100 according to a first embodiment.

Hereinafter, embodiments of the present invention will be described with reference to the accompanying drawings. In the following embodiments, components having the same functions are identified by the same reference numerals and the description thereof will not be repeated.

FIRST EMBODIMENT OF THE INVENTION

A semiconductor integrated circuit according to a first embodiment of the present invention will be described with reference to FIG. 1. FIG. 1 is a view illustrating the structure of the semiconductor integrated circuit 100 according to the first embodiment of the present invention.

In FIG. 1, the reference numeral 1 refers to a semiconductor chip; 2 to a logic circuit block; 3 to memory macros; and 4 to a memory block in which the memory macros 3 are arranged.

The reference numeral 5 refers to logic circuit power terminals for supplying power to the logic circuit block 2 outside from the semiconductor integrated circuit 100; 6 to memory power terminals for supplying power to the memory block 4 outside from the semiconductor integrated circuit 100; 7 to logic circuit power wires for supplying the power from the logic circuit power terminals 5 to the logic circuit block 2; and 8 to memory power wires for supplying the power from the memory power terminals 6 to the memory block 4.

The memory block 4 is provided in a desired position on the semiconductor chip 1. Specifically, the memory macros 3 included in the semiconductor chip 1 are collectively arranged in the memory block 4 to form a group of memory macros. In this embodiment, all of the memory macros 3 on the semiconductor chip 1 form the single memory block 4.

The memory power terminals 6 supply power to the memory block 4 through the memory power wires 8. The memory power terminals 6 are disposed adjacent to the memory block 4 in the peripheral portion of the semiconductor chip 1.

The memory power wires 8 are collectively provided over the memory block 4. The logic circuit power wires 7 are provided over the logic circuit block 2.

In this way, according to this embodiment, on the semiconductor chip in the semiconductor integrated circuit 100, in which the memories whose power source has to be different from that of the logic circuits are contained, it is possible to separate the area where the memory power wires 8 are provided and the area where the logic circuit power wires 7 are provided.

It thus becomes possible to supply, with a low resistance, each block with the logic circuit power or the memory power required by that block. That is, it becomes possible to suppress voltage drops in the power supply voltages supplied to the logic circuit block 2 and the memory macros 3, respectively, and thereby achieve stable operation.

In the semiconductor integrated circuit 100, the set of logic circuit power wires 7 and the set of memory power wires 8 that must be present in large numbers over the semiconductor chip 1 are each provided collectively, thereby increasing the wire efficiency. In this embodiment, the chip area of the entire semiconductor chip 1 can thus be reduced.

In the memory block 4, all of the memory macros 3 are preferably arranged in a matrix. Then, the power wires and the like provided for the memory macros 3 can be shared by the memory macros 3. As a result, the resistance of the memory power wires 8 can be reduced further.

Also, the memory power wires 8 are preferably formed in a mesh in a plurality of wiring layers. Then, the resistance of the memory power wires 8 can be reduced further.

Bit lines of the memory macros 3 preferably run in the same direction, and word lines of the memory macros 3 preferably run in the same direction. Then, the memory macros 3 can be easily connected with the memory power wires 8.

At least either the number of bit lines or the number of word lines of each memory macro 3 may be the same, so that the memory macros 3 can be arranged in a matrix. Then, the memory macros 3 can be easily placed in proper alignment. Furthermore, power can be easily supplied to the memory macros 3, and the power wire resistance to the memory macros can be made uniform. That is, it is possible to suppress the influence of power variations and thereby achieve stable operation of the memory macros 3.

Moreover, it is preferable that the input/output terminal(s) of each memory macro 3 be disposed on the side of the memory macro 3 that faces the logic circuit block 2. Then, the logic circuit block 2 for the memory control can be collectively disposed in proper order in an easy manner. This enables the area of the entire semiconductor chip to be reduced easily.

Also, the input/output terminals of the memory macros 3 are preferably formed in multiple wiring layers. Then, it is possible to increase the wiring flexibility of the input/output signal wires extending to the memory block 4.

Furthermore, the memory block 4 on the semiconductor chip 1 is preferably near the periphery of the semiconductor chip 1 as shown in FIG. 1. Then, the distances between the memory macros 3 and the memory power terminals 6 can be minimized.

SECOND EMBODIMENT OF THE INVENTION

Figure 2:
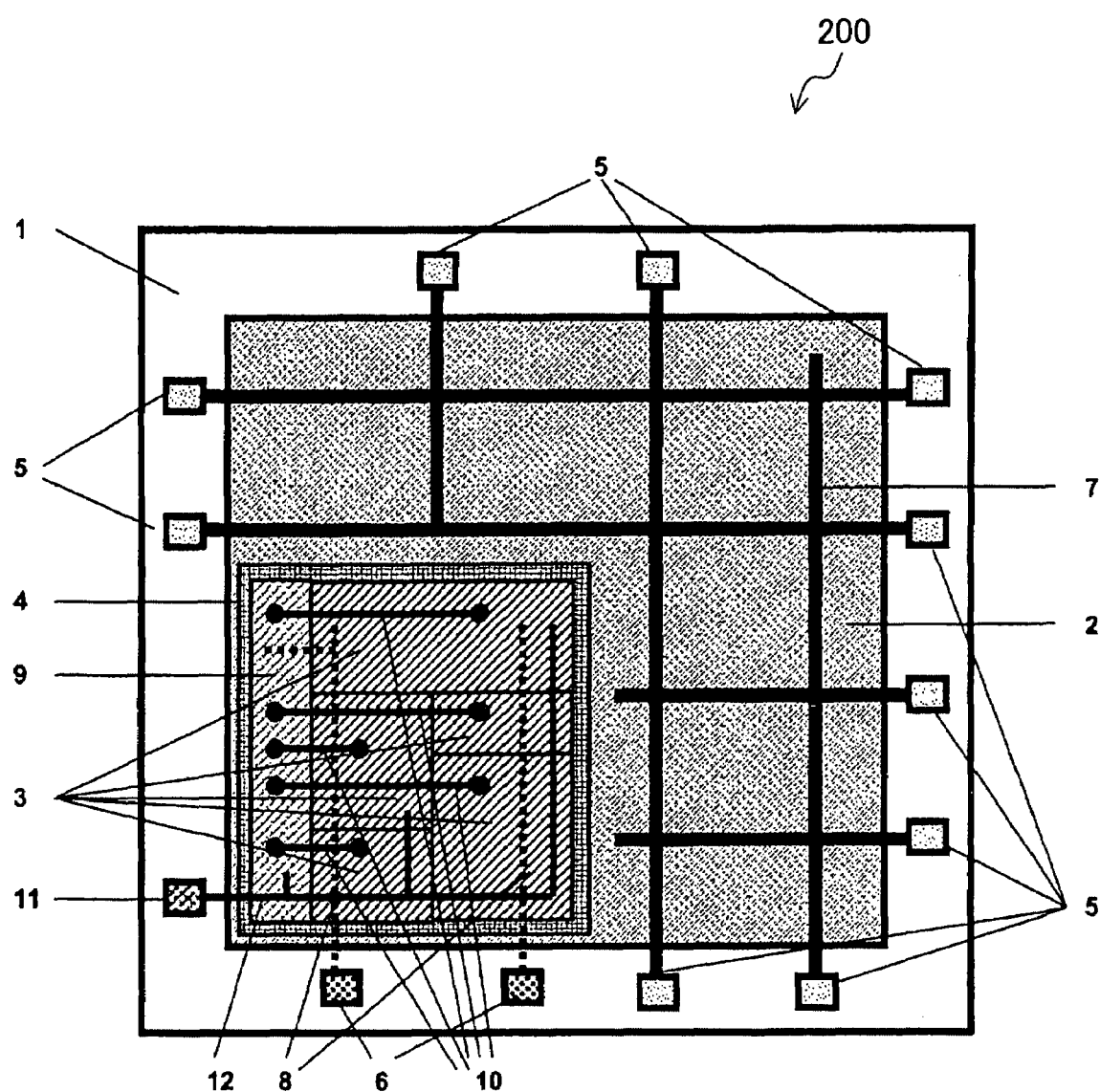
FIG. 2 is a view illustrating the structure of a semiconductor integrated circuit 200 according to a second embodiment.
Figure 3:
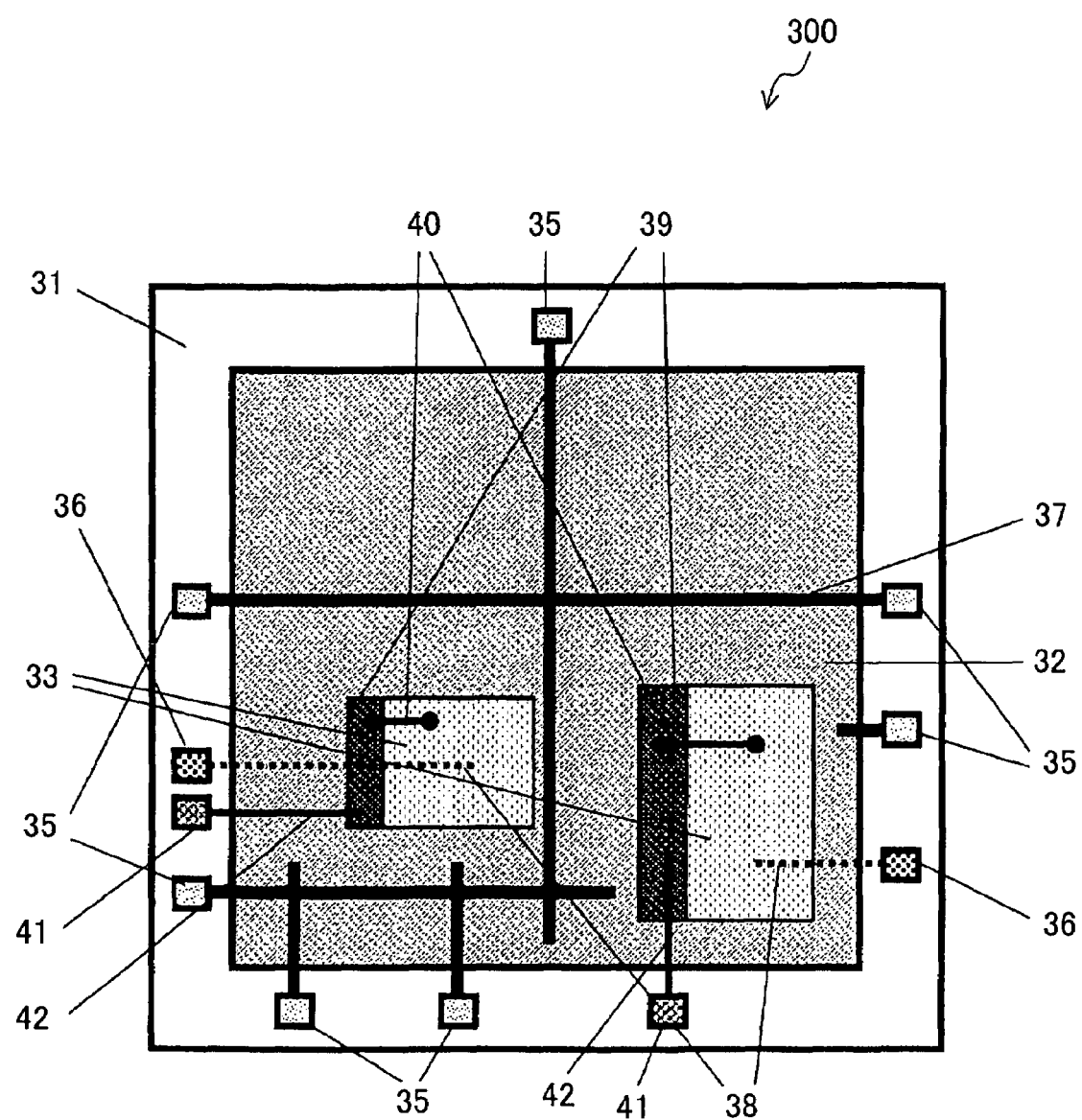
FIG. 3 is a block diagram illustrating the structure of a conventional semiconductor integrated circuit.

A semiconductor integrated circuit according to a second embodiment of the present invention will be described with reference to FIG. 2. FIG. 2 is a view illustrating the structure of the semiconductor integrated circuit 200 according to the second embodiment of the present invention.

As shown in FIG. 2, the semiconductor integrated circuit 200 has a structure in which a power circuit macro 9, internal power wires 10, a memory high-voltage power terminal 11, and a memory high-voltage power wire 12 are added to the semiconductor integrated circuit 100.

In FIG. 2, the power circuit macro 9 generates internal power on the semiconductor chip 1.

The internal power wires 10 supply the internal power generated by the power circuit macro 9 to a memory block 4.

The memory high-voltage power terminal 11 supplies high-voltage power to the power circuit macro 9 outside from the semiconductor integrated circuit 200.

The memory high-voltage power wire 12 supplies the high-voltage power from the memory high-voltage power terminal 11 to the power circuit macro 9.

Based on the external high-voltage power supplied from the memory high-voltage power terminal 11, the power circuit macro 9 generates the internal power, which has a voltage that is different from that of the power supplied from the memory power terminals 6, and supplies the generated internal power to the memory block 4 through the internal power wires 10.

Although not shown in FIG. 2, the power circuit macro 9 includes a power generation circuit block and a smoothing capacitor block.

The power generation circuit block generates the internal power based on the memory high-voltage power supplied from the memory high-voltage power terminal 11.

The smoothing capacitor block includes smoothing capacitors and is connected with the memory high-voltage power and the internal power to suppress voltage variations therein.

The number of power circuit macros 9 included for the plurality of memory macros 3 may be one (i.e., one macro). In a case where more memory macros 3 are needed, the number of power circuit macros 9 may be increased, i.e., two, three, or more macros may be included.

The structure described above produces the following effects in addition to the effects obtainable in the semiconductor integrated circuit of the first embodiment.

Specifically, in this embodiment, the memory power circuit (the power circuit macro 9) is shared by the multiple memory macros unlike in the conventional semiconductor chip in which the memory power circuits that cause an increase in the chip area are included for the respective memory macros. Thus, in this embodiment, the area occupied by the power circuit macro 9 and hence the area of the semiconductor chip 1 can be reduced.

Also, in this embodiment, the power circuit macro 9 is divided into the power generation circuit block and the smoothing capacitor block. This structure allows the macro shape of the power circuit macro 9 to be easily changed by changing the arrangement, number, and shape of the smoothing capacitors included in the smoothing capacitor block. That is, this structure increases the flexibility of the arrangement of the power circuit macro 9 on the semiconductor chip 1, which consequently allows the area of the semiconductor chip 1 to be reduced.

Furthermore, if at least either the vertical or horizontal size of the power circuit macro 9 is the same as the vertical or horizontal size of the memory block 4, then at least the side of the memory block 4 and the side of the power circuit macro 9 that face each other will have substantially the same length. As a result, it becomes possible to increase the layout efficiency of the macro arrangement on the semiconductor chip 1 and the wire efficiency of the memory power wires 8 in the upper layers.

Also, in this embodiment, since the power circuit macro 9 is placed adjacent to the memory block 4, the lengths of the internal power wires 10 that supply power from the power circuit macro 9 to the memory macros 3 can be shortened. That is, the internal power wires 10 that supply power from the power circuit macro 9 to the memory macros 3 have low resistance. In this embodiment, it is thus possible to suppress voltage drops in the power supply voltage supplied to the memory macros 3 and hence easily achieve stable operation of the memory macros 3.

Moreover, if the power circuit macro 9 is disposed between the memory block 4 and the memory power terminals 6, then the memory power wires 8 that connect the memory power terminals 6 and the power circuit macro 9, and the internal power wires 10 that connect the power circuit macro 9 and the memory macros 3 have low resistance, with external influences thereon reduced. As a result, it becomes possible to suppress voltage drops in the power supply voltage supplied to the memory macros 3 and hence easily achieve stable operation of the memory macros 3.

If the power circuit macro 9 is disposed between the memory block 4 and the memory high-voltage power terminal 11, then the memory high-voltage power wire 12 that connects the memory high-voltage power terminal 11 and the power circuit macro 9, and the internal power wires 10 that connect the power circuit macro 9 and the memory macros 3 have low resistance. As a result, it becomes possible to suppress voltage drops in the power supply voltage supplied to the memory macros 3, thereby easily achieving stable operation of the memory macros 3.

In this embodiment, the power supply voltage that is directly supplied to the memory macros 3 is different from the power supply voltage supplied to the power circuit macro 9. However, the memory power supplied from the memory power terminals 6 may be used by the power circuit macro 9 as well as by the memory macros 3. To be specific, for example, the power supply voltage directly supplied to the memory macros 3 and the power supply voltage supplied to the power circuit macro 9 may be the same power supply voltage that is supplied from a common power terminal.

Then, the number of power terminals and the area on the semiconductor chip 1 occupied by the power wires can be reduced. Consequently, the memory power terminals 6 are allowed to have low resistance, whereby voltage drops in the power supply voltage supplied to the memory macros 3 can be suppressed and stable operation of the memory macros 3 can thus be easily achieved. In this case, the power circuit macro 9 generates the internal power based on the power supply voltage directly supplied to the memory macros 3 and on the power supply voltage supplied only to the power circuit macro 9 from the memory high-voltage power terminal 11, and the generated internal power is provided to the memory macros 3 through the internal power wires 10.

Moreover, in the example described in this embodiment, a high voltage is applied to the memory high-voltage power terminal 11 disposed on the semiconductor chip 1, but the voltage applied to the memory high-voltage power terminal 11 is not limited to this. For instance, a low voltage may be supplied to the power circuit macro 9, and the power circuit macro may increase the supplied low voltage so as to supply, as the internal power, the increased voltage to the memory macros 3. In that case, the same effects are also attainable.

In the examples described in the first and second embodiments, the memory block 4 and the logic circuit block 2 are both provided on the semiconductor chip 1. However, applications of the present invention are not limited to this. For example, in a case where other circuit blocks such as an analog circuit block are included in addition to the memory block 4 and the logic circuit block 2, the same effects are also achievable.

Also, in the examples described in the first and second embodiments, the single memory block 4 is provided on the semiconductor chip 1. Nevertheless, the number of memory blocks 4 provided on the semiconductor chip 1 is not limited to this. That is, in a case where a plurality of memory blocks 4 are disposed on the semiconductor chip 1, the same effects are also achievable.

As described above, the semiconductor integrated circuits according to the present invention produce the effects that voltage drops in the power wires to the logic circuits and to the memory macros are suppressed, and the wire efficiency on the semiconductor chip is increased to achieve a reduction in the entire semiconductor chip area. The semiconductor integrated circuits of the present invention are thus applicable, e.g., to semiconductor integrated circuits that include memories and logic circuits, analog circuits, etc.

What is claimed is:
1. A semiconductor integrated circuit comprising:
   a plurality of memory macros, to which first power is supplied;
   a logic circuit block, to which second power is supplied;
   an input terminal for supplying the first power; and a plurality of memory power wires provided over the plurality of memory macros,
wherein the plurality of memory macros are collectively disposed as a memory block on a semiconductor chip, and
the input terminal is connected to at least two of the memory macros through at least one of the memory power wires.

2. The semiconductor integrated circuit of claim 1, wherein the memory block is formed of all of the memory macros.

3. The semiconductor integrated circuit of claim 1, wherein the memory power wires are formed in a mesh in a plurality of wiring layers.

4. The semiconductor integrated circuit of claim 3, wherein bit lines of the memory macros are in the same direction and word lines of the memory macros are in the same direction.

5. The semiconductor integrated circuit of claim 4, wherein the memory macros that form the memory block are arranged in a matrix, and
at least either the number of bit lines or the number of word lines of each of the memory macros is the same.

6. The semiconductor integrated circuit of claim 5, wherein an input/output terminal of each of the memory macros is disposed on a side of the memory block that faces the logic circuit block.

7. The semiconductor integrated circuit of claim 6, wherein the input/output terminals correspond to the memory power wires and are formed in a plurality of wiring layers.

8. The semiconductor integrated circuit of claim 1, further comprising a power circuit macro for generating fourth power based on third power which is input from outside the semiconductor integrated circuit and supplying the fourth power to the memory macros,
wherein the power circuit macro is provided in a one-to-one correspondence with the memory block, and
internal power wires for supplying the fourth power to the memory macros are formed over the memory block.

9. The semiconductor integrated circuit of claim 8, wherein the power circuit macro is disposed between the memory block and a power terminal to which the first power is input.

10. The semiconductor integrated circuit of claim 8, wherein the power circuit macro is disposed between the memory block and a power terminal to which the third power is input.

11. The semiconductor integrated circuit of claim 8, wherein the power circuit macro includes:
a power generation circuit block for generating power based on the third power; and
a smoothing capacitor block for suppressing voltage variation in the power generated by the power generation circuit block.

12. The semiconductor integrated circuit of claim 8, wherein a side of the memory block and a side of the power circuit macro that face each other have substantially the same length.

13. The semiconductor integrated circuit of claim 8, wherein the memory block and the power circuit macro are substantially adjacent to each other.

14. The semiconductor integrated circuit of claim 1, wherein the first power and the second power are not the same.

15. A semiconductor integrated circuit comprising:
a plurality of memory macros, to which first power is supplied;
a logic circuit block, to which second power is supplied;
wherein the plurality of memory macros are collectively disposed as a memory block on a semiconductor chip, and
memory power wires for supplying the first power to the memory macros that form the memory block are provided over the memory block,
wherein the semiconductor integrated circuit further comprises a power circuit macro for generating fourth power based on third power which is input from outside the semiconductor integrated circuit and supplying the fourth power to the memory macros,
wherein the power circuit macro is provided in a one-to-one correspondence with the memory block, and
internal power wires for supplying the fourth power to the memory macros are formed over the memory block.

16. The semiconductor integrated circuit of claim 15, wherein the power circuit macro includes:
a power generation circuit block for generating power based on the third power; and
a smoothing capacitor block for suppressing voltage variation in the power generated by the power generation circuit block.

17. The semiconductor integrated circuit of claim 15, wherein a side of the memory block and a side of the power circuit macro that face each other have substantially the same length.

18. The semiconductor integrated circuit of claim 15, wherein the memory block and the power circuit macro are substantially adjacent to each other.

19. The semiconductor integrated circuit of claim 15, wherein the power circuit macro is disposed between the memory block and a power terminal to which the third power is input.

* * * * *